US009196941B2

(12) United States Patent
Chuang et al.

(10) Patent No.: US 9,196,941 B2
(45) Date of Patent: Nov. 24, 2015

(54) CROSS-COUPLED BANDPASS FILTER

(75) Inventors: Min-Han Chuang, Taichung Hsien (TW); Chia-Chu Lai, Taichung Hsien (TW); Bo-Shiang Fang, Taichung Hsien (TW); Ho-Chuan Lin, Taichung Hsien (TW); Sung-Chun Wu, Taichung Hsien (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 607 days.

(21) Appl. No.: 13/435,422

(22) Filed: Mar. 30, 2012

(65) Prior Publication Data

US 2013/0154765 A1 Jun. 20, 2013

(30) Foreign Application Priority Data

Dec. 14, 2011 (TW) ............................. 100146132 A

(51) Int. Cl.
*H03H 7/09* (2006.01)
*H01P 1/203* (2006.01)
*H01P 7/08* (2006.01)

(52) U.S. Cl.
CPC ........ *H01P 1/20345* (2013.01); *H01P 1/20381* (2013.01)

(58) Field of Classification Search
CPC .................................... H03H 7/09; H01P 7/08
USPC .................................. 333/175, 177, 204, 219
See application file for complete search history.

(56) References Cited

U.S. PATENT DOCUMENTS

| | | | | |
|---|---|---|---|---|
| 4,992,759 | A * | 2/1991 | Giraudeau et al. | 333/204 |
| 6,549,097 | B2 * | 4/2003 | Guillon et al. | 333/174 |
| 6,762,655 | B2 * | 7/2004 | Wichern | 333/175 |
| 8,058,950 | B1 * | 11/2011 | Senderowicz | 333/175 |
| 8,143,976 | B2 * | 3/2012 | Wyland | 333/260 |
| 8,576,026 | B2 * | 11/2013 | Liu et al. | 333/204 |
| 2013/0141187 | A1 * | 6/2013 | Chuang et al. | 333/175 |

* cited by examiner

*Primary Examiner* — Dean Takaoka
(74) *Attorney, Agent, or Firm* — Mintz Levin Cohn Ferris Glovsky and Popeo, P.C.; Peter F. Corless; Steven M. Jensen

(57) ABSTRACT

A cross-coupled bandpass filter includes first, second, third and fourth resonators such that magnetic couplings are generated between the first and second resonators, between the third and fourth resonators and between the first and fourth resonators, a capacitive coupling is generated between the second and third resonators, and the magnetic coupling between the first and fourth resonators has a polarity opposite to that of the capacitive coupling between the second and third resonators, thereby generating two transmission zeros in a transmission rejection band.

6 Claims, 3 Drawing Sheets

CROSS-COUPLED BANDPASS FILTER

CROSS-REFERENCES TO RELATED APPLICATIONS

This application claims under 35 U.S.C. §119(a) the benefit of Taiwanese Application No. 100146132, filed Dec. 14, 2011, the entire contents of which is incorporated herein by reference.

BACKGROUND OF THE INVENTION

1. Field of the Invention

The present invention relates to cross-coupled filters, and more particularly, to a cross-coupled bandpass filter for generating transmission zeros in a transmission rejection band.

2. Description of Related Art

Current portable communication devices have high requirements on pass band selectivity. Quadruplet cross-coupled bandpass filters are usually used to achieve high selectivity. In general, a microstrip filter using electric cross-coupling can generate two transmission zeros in a rejection band.

FIG. 1A is a schematic view of a conventional quadruplet cross-coupled bandpass filter using electric cross-coupling. Referring to FIG. 1A, the conventional bandpass filter has four microstrip open-loop resonators 12, 14, 16, 18 formed on a dielectric substrate 11. The resonator 12 serves as an input port and the resonator 14 serves as an output port. FIG. 1B shows the frequency responses of the bandpass filter of FIG. 1A. Referring to FIG. 1B, curve C11 shows the reflection coefficient ($S_{11}$) of the input port (resonator 12), and curve C12 shows that the forward transmission coefficient ($S_{21}$) from the input port (resonator 12) to the output port (resonator 14) has two transmission zeros generated in the rejection band. However, during an integrated passive device (IPD) fabrication process, input and output signals are fed through capacitors. As such, capacitors connected to the input port (resonator 12) and the output port (resonator 14), respectively, are too close to each other, thereby easily causing short circuits. Since it is difficult to achieve electric cross-coupling in an IPD fabrication process so as to generate a transmission zero in a high frequency rejection band, using magnetic cross-coupling to generate two transmission zeros in a rejection band has currently become a research focus.

FIG. 2A shows a triplet magnetically cross-coupled bandpass filter 20 using an IPD fabrication process. Referring to FIG. 2A, the bandpass filter 20 has a resonator consisting of an inductor 22 and a capacitor 23*a*, a resonator consisting of an inductor 24 and a capacitor 25*a* (including a lower polar plate 25*b*) and a resonator consisting of an inductor 26 and a capacitor 27*a* (including a lower polar plate 27*b*). The inductor 24 and the capacitor 25*a* serve as a signal input port, and the inductor 26 and the capacitor 27*a* serve as a signal output port. Two terminals of the inductor 22 form an opening 22*a*, and the two terminals are electrically connected to each other through the capacitor 23*a*. Two terminals of the inductor 24 form an opening 24*a*, and the two terminals are electrically connected to each other through the capacitor 25*a* and a through hole 25*c*. Similarly, two terminals of the inductor 26 form an opening 26*a* and the two terminals are electrically connected to each other through the capacitor 27*a* and a through hole 27*c*. FIG. 2B shows the frequency responses of the bandpass filter 20. Curve C21 shows that the forward transmission coefficient $S_{21}$ has a transmission zero generated in a low frequency rejection band, but has no transmission zero in a high frequency rejection band. Curve C22 shows that the input reflection coefficient $S_{11}$ and the output reflection coefficient $S_{22}$ are nearly the same in a symmetrical configuration.

As described above, it is difficult to achieve electric cross-coupling in an IPD fabrication process in the prior art. Also, it is difficult to use magnetic cross-coupling to design a bandpass filter with two transmission zeros in a rejection band. Therefore, there is a need to provide a cross-coupled bandpass filter that is applicable in an IPD fabrication process so as to effectively use magnetic cross-coupling to generate two transmission zeros in a rejection band.

SUMMARY OF THE INVENTION

In view of the above-described drawbacks, the present invention provides a cross-coupled bandpass filter, which comprises: a first resonator comprised of a first inductor and a first capacitor and having a first opening formed by two terminals of the first inductor, wherein the two terminals of the first inductor are electrically connected to each other through the first capacitor; a second resonator comprised of a second inductor and a second capacitor and having a second opening formed by two terminals of the second inductor, wherein the two terminals of the second inductor are electrically connected to each other through the second capacitor and a first interconnecting inductor; a third resonator comprised of a third inductor and a third capacitor and having a third opening formed by two terminals of the third inductor, wherein the two terminals of the third inductor are electrically connected to each other through the third capacitor and a second interconnecting inductor; and a fourth resonator comprised of a fourth inductor and a fourth capacitor and having a fourth opening formed by two terminals of the fourth inductor, wherein the two terminals of the fourth inductor are electrically connected to each other through the fourth capacitor, wherein magnetic couplings are generated between the first and second resonators, between the third and fourth resonators, and between the first and fourth resonators, and a capacitive coupling is generated between the second and third resonators.

In an embodiment, the first, second, third and fourth inductors and the first and second interconnecting inductors are made of a magnetic semiconductor or metal material.

The present invention provides another cross-coupled bandpass filter, which comprises: a first resonator having a first opening; a second resonator having a second opening; a third resonator having a third opening; and a fourth resonator having a fourth opening, wherein magnetic couplings are generated between the first and second resonators, between the third and fourth resonators and between the first and fourth resonators, and a capacitive coupling is generated between the second and third resonators.

In an embodiment, the magnetic coupling between the first and fourth resonators has a polarity opposite to that of the capacitive coupling between the second and third resonators.

Further, a first resonator can be a signal input port and the fourth resonator can be a signal output port. The filter can further comprise a fifth capacitor electrically connected between the second and third resonators.

Compared with the prior art, the present invention achieves a preferred transmission zero effect and overcomes the conventional difficulty of generating two transmission zeros in a rejection band using an integrated passive device (IPD) fabrication process, thereby improving the selectivity of the bandpass filter and the process compatibility.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that all the drawings are not intended to limit the present invention. Various modification and variations can be made without departing from the spirit of the present invention. Further, terms such as "first", "second", "opening", "terminals" etc. are merely for illustrative purpose and should not be construed to limit the scope of the present invention.

The present invention provides a quadruplet magnetically cross-coupled bandpass filter applicable in an IPD fabrication process for generating two transmission zeros in a rejection band, thereby achieving a bandpass filter with high selectivity.

Figure 3A:
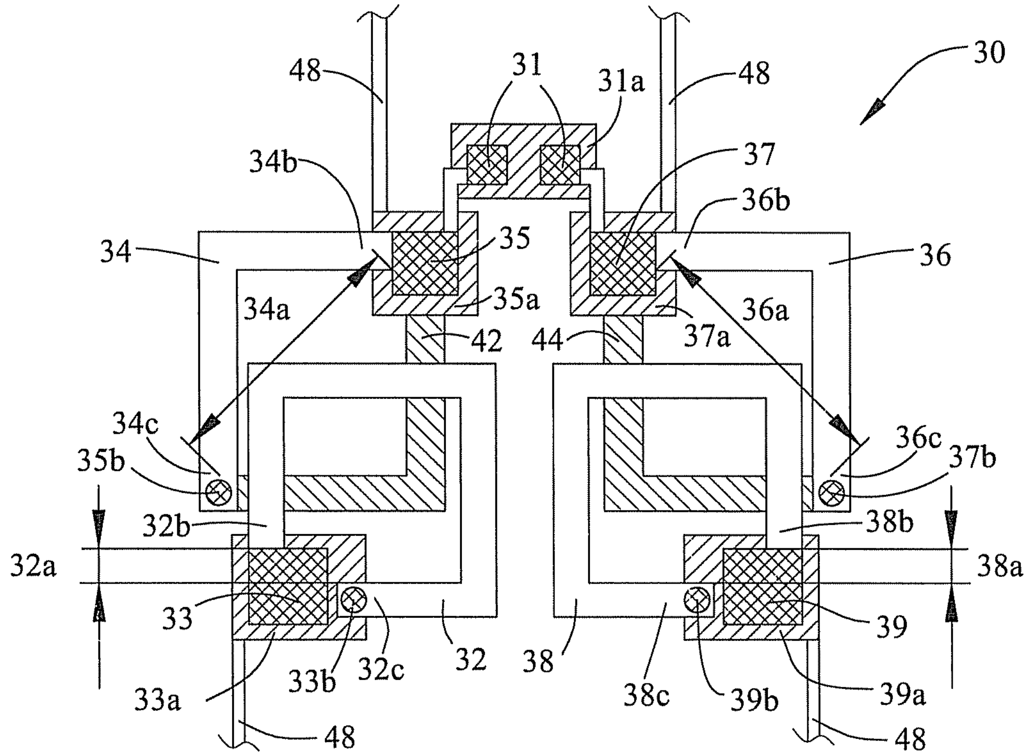
FIG. 3A is a schematic view of a quadruplet magnetically cross-coupled bandpass filter according to an embodiment of the present invention.

FIG. 3A is a schematic view of a quadruplet magnetically cross-coupled bandpass filter 30 according to an embodiment of the present invention. Referring to FIG. 3A, the bandpass filter 30 is a quadruplet magnetically cross-coupled structure consisting of first, second, third and fourth resonators. The first resonator consists of an inductor 32 and a capacitor 33. The second resonator consists of an inductor 34 and a capacitor 35. The third resonator consists of an inductor 36 and a capacitor 37. The fourth resonator consists of an inductor 38 and a capacitor 39. The inductors 32, 34, 36, 38 are made of such as a magnetic semiconductor or metal material.

The first resonator has an opening 32*a* formed by two terminals 32*b*, 32*c* of the inductor 32. The two terminals 32*b*, 32*c* of the inductor 32 are electrically connected to each other through the capacitor 33. For example, the terminal 32*b* of the inductor 32 is electrically connected to a through hole 33*b* of the inductor 32 through the capacitor 33 and a lower polar plate 33*a* of the capacitor 33 so as to be further electrically connected to the terminal 32*c* through the through hole 33*b*, thereby forming an open-loop resonator structure.

The second resonator has an opening 34*a* formed by two terminals 34*b*, 34*c* of the inductor 34. The two terminals 34*b*, 34*c* of the inductor 34 are electrically connected to each other through the capacitor 35 and an interconnecting inductor 42. For example, the terminal 34*b* of the inductor 34 is electrically connected to one end of the interconnecting inductor 42 through the capacitor 35 and a capacitor lower polar plate 35*a* of the capacitor 35 and the terminal 34*c* of the inductor 34 is electrically connected to the other end of the interconnecting inductor 42 through a through hole 35*b* of the inductor 34, thereby forming an open-loop resonator structure.

The third resonator has an opening 36*a* formed by two terminals 36*b*, 36*c* of the inductor 36. The two terminals 36*b*, 36*c* of the inductor 36 are electrically connected to each other through the capacitor 37 and an interconnecting inductor 44. For example, the terminal 36*b* of the inductor 36 is electrically connected to one end of the interconnecting inductor 44 through the capacitor 37 and a capacitor lower polar plate 37*a* of the capacitor 37 and the terminal 36*c* of the inductor 36 is electrically connected to the other end of the interconnecting inductor 44 through a through hole 37*b* of the inductor 36, thereby forming an open-loop resonator structure.

The fourth resonator has an opening 38*a* formed by two terminals 38*b*, 38*c* of the inductor 38. The two terminals 38*b*, 38*c* of the inductor 38 are electrically connected to each other through the capacitor 39. For example, the terminal 38*b* of the inductor 38 is electrically connected to a through hole 39*b* of the inductor 38 through the capacitor 39 and a lower polar plate 39*a* of the capacitor 39 so as to be further electrically connected to the terminal 38*c* through the through hole 39*b*, thereby forming an open-loop resonator structure.

Referring to the drawing, portions of the inductors 32, 38 are disposed inside the openings 34*a*, 36*a* of the second and third resonators, respectively. The opening 32*a* of the first resonator and the opening 38*a* of the fourth resonator are symmetrically disposed outside the openings 34*a*, 36*a* and spaced away from each other. The first resonator serves as a signal input port and the fourth resonator serves as a signal output port.

In the present embodiment, magnetic couplings are generated between the first and second resonators, between the third and fourth resonators and between the first and fourth resonators. In addition, a capacitor is connected in series between the second and third resonators for providing a capacitive coupling between the second and third resonators. In the present embodiment, the second resonator is electrically connected to the third resonator through a capacitor 31 and a lower polar plate 31*a* of the capacitor 31. As such, the capacitor 31 is electrically connected in series between the second and third resonators to generate a capacitive coupling. Further, the magnetic coupling between the first and fourth resonators (i.e., the input and output ports) has a polarity opposite to that of the capacitive coupling between the second and third resonators. As such, the quadruplet magnetically cross-coupled bandpass filter 30 can effectively generate two transmission zeros in the transmission rejection band. In the present embodiment, one of the transmission zeros is generated in a high frequency rejection band and the other transmission zero is generated in a low frequency rejection band. Therefore, the present invention overcomes the conventional difficulty of generating a transmission zero in a high frequency band using an IPD fabrication process.

Figure 1A:
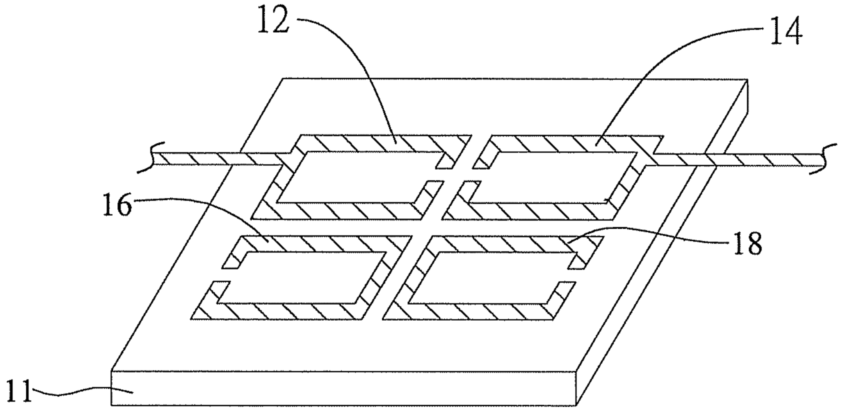
FIG. 1A (PRIOR ART)
FIG. 1A is a schematic view of a conventional quadruplet cross-coupled bandpass filter using electric cross-coupling.
Figure 1B:
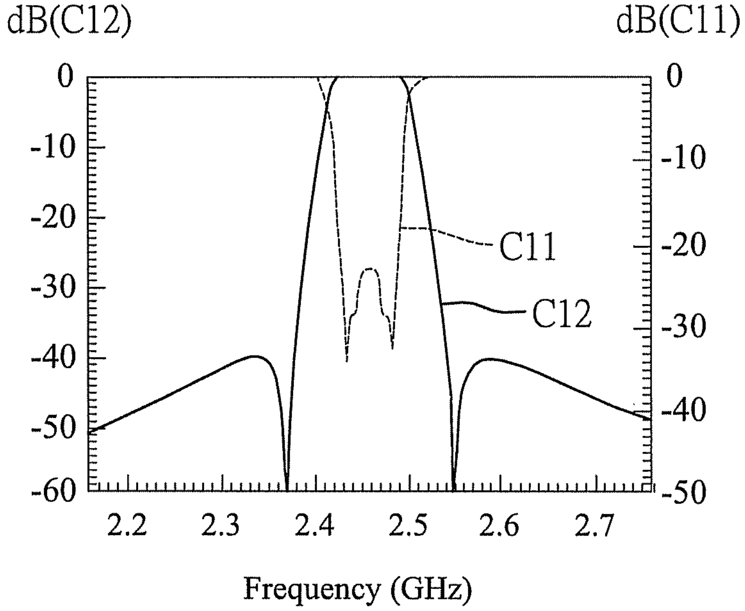
FIG. 1B (PRIOR ART)
FIG. 1B is a graph showing the frequency responses of the bandpass filter of FIG. 1A.
Figure 2A:
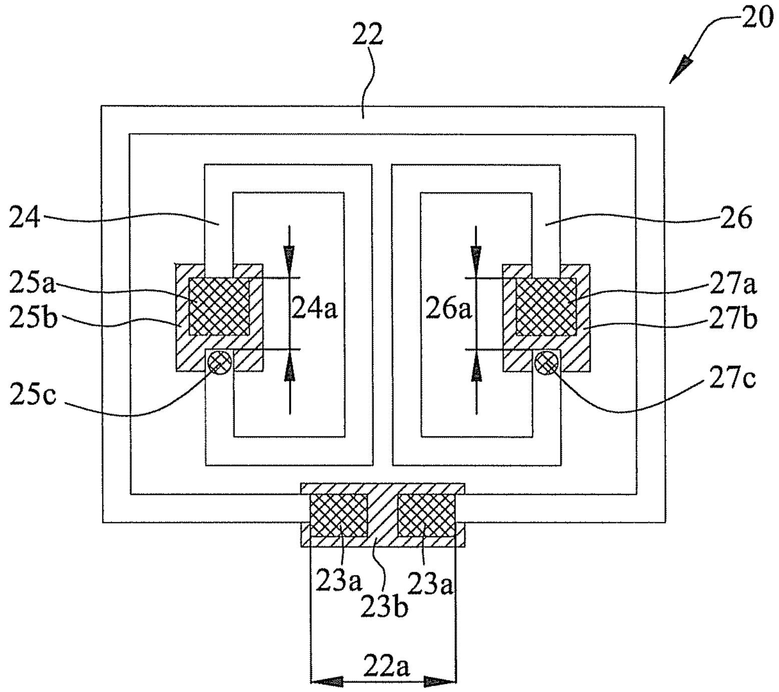
FIG. 2A is a schematic view of a conventional triplet magnetically cross-coupled bandpass filter using an integrated passive device (IPD) fabrication process.
Figure 2B:
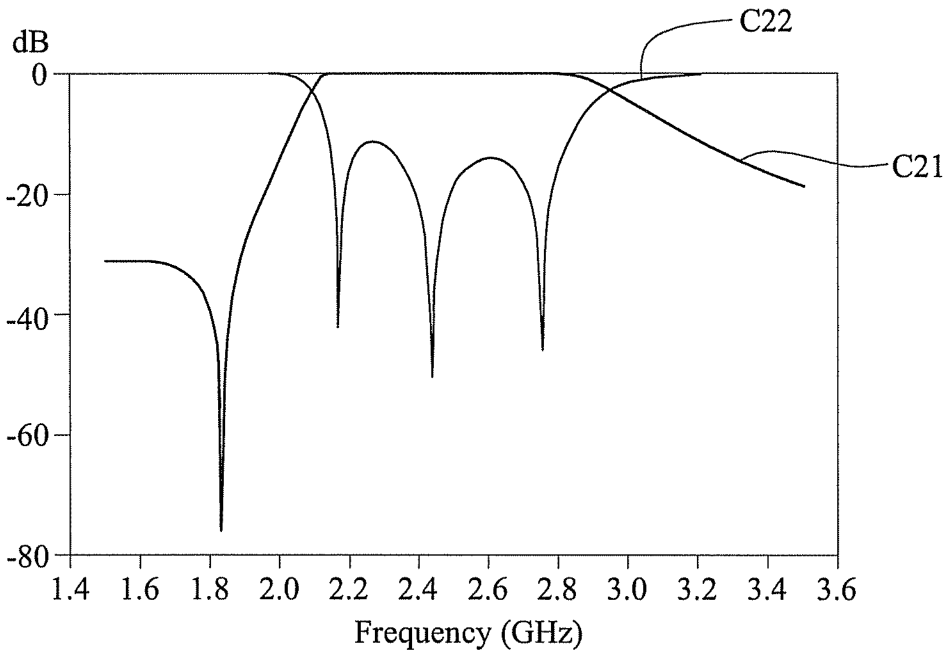
FIG. 2B is a graph showing the frequency responses of the bandpass filter of FIG. 2A.
Figure 3B:
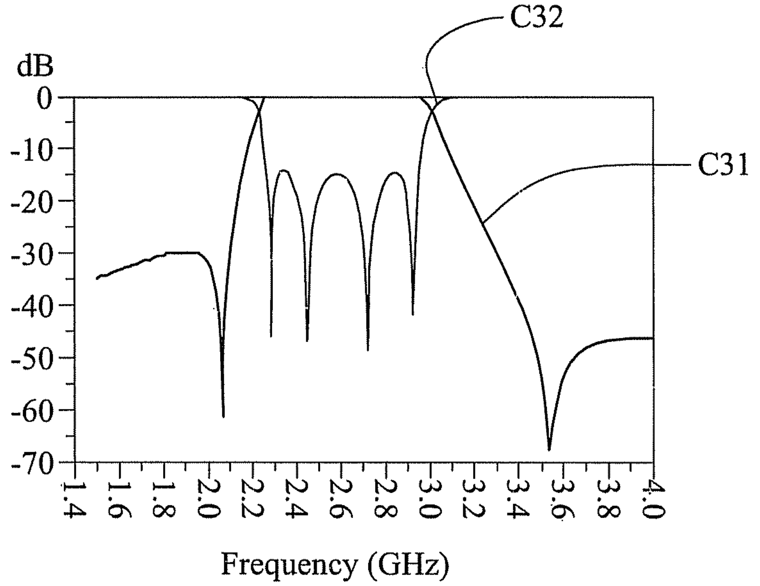
FIG. 3B is a graph showing the frequency responses of the bandpass filter of FIG. 3A.

FIG. 3B shows the frequency responses of the magnetically cross-coupled bandpass filter 30. Curve C31 ($S_{21}$) shows two transmission zeros are effectively generated in the transmission rejection band. In particular, one of the transmission zeros is generated in the high frequency rejection band. Curve C32 shows that the input reflection ($S_{11}$) and the output reflection ($S_{22}$) are nearly the same in a symmetrical configuration. Referring to the drawing, the magnetically cross-coupled bandpass filter 30 generates a transmission zero of −67.464 dB at a high frequency rejection band of about 3.531 GHz. Compared with the frequency responses of FIG. 1B (a transmission zero at a frequency of about 2.5 GHz), the present invention achieves a preferred high-frequency transmission zero generation effect and overcomes the conventional difficulty of generating two transmission zeros in a rejection band using an IPD fabrication process.

Therefore, the present invention provides a bandpass filter with high selectivity so as to meet requirements of portable communication devices. Compared with the prior art that utilizes electric cross-coupling to generate a transmission zero in a high frequency rejection band, the present invention utilizes magnetic cross-coupling to generate a transmission zero in a high frequency rejection band, thereby improving the selectivity of the bandpass filter and the process compatibility.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A cross-coupled bandpass filter, comprising:

a first resonator comprised of a first inductor and a first capacitor and having a first opening formed by two terminals of the first inductor, wherein the two terminals of the first inductor are electrically connected to each other through the first capacitor;

a second resonator comprised of a second inductor and a second capacitor and having a second opening formed by two terminals of the second inductor, wherein the two terminals of the second inductor are electrically connected to each other through the second capacitor and a first interconnecting inductor;

a third resonator comprised of a third inductor and a third capacitor and having a third opening formed by two terminals of the third inductor, wherein the two terminals of the third inductor are electrically connected to each other through the third capacitor and a second interconnecting inductor; and a fourth resonator comprised of a fourth inductor and a fourth capacitor and having a fourth opening formed by two terminals of the fourth inductor, wherein the two terminals of the fourth inductor are electrically connected to each other through the fourth capacitor, wherein magnetic couplings are generated between the first and second resonators, between the third and fourth resonators, and between the first and fourth resonators, and a capacitive coupling is generated between the second and third resonators.

2. The filter of claim 1, wherein the first, second, third and fourth inductors and the first and second interconnecting inductors are made of a magnetic semiconductor or metal material.

3. The filter of claim 1, further comprising a fifth capacitor electrically connected between the second and third resonators.

4. The filter of claim 1, wherein the magnetic coupling between the first and fourth resonators has a polarity opposite to that of the capacitive coupling between the second and third resonators.

5. The filter of claim 1, wherein the first resonator is a signal input port and the fourth resonator is a signal output port.

6. The filter of claim 5, wherein the first and fourth openings are disposed symmetrically and spaced away from each other.

* * * * *